United States Patent [19]

Kushibiki et al.

[11] Patent Number: 4,946,533
[45] Date of Patent: Aug. 7, 1990

[54] METHOD OF PREPARING VOLUME TYPE HOLOGRAM FILM

[75] Inventors: Nobuo Kushibiki, Kanagawa; Yoko Yoshinaga, Machida; Naosato Taniguchi; Tetsuro Kuwayama, both of Kanagawa, all of Japan

[73] Assignee: Canon Kabushiki Kaisha, Tokyo, Japan

[21] Appl. No.: 346,513

[22] Filed: May 2, 1989

Related U.S. Application Data

[63] Continuation-in-part of Ser. No. 195,644, May 18, 1988, Pat. No. 4,871,411.

[30] Foreign Application Priority Data

| May 21, 1987 | [JP] | Japan | 62-122419 |
| May 21, 1987 | [JP] | Japan | 62-122420 |
| May 21, 1987 | [JP] | Japan | 62-122421 |
| Oct. 30, 1987 | [JP] | Japan | 62-273349 |

[51] Int. Cl.$^5$ .................................... B32B 31/18
[52] U.S. Cl. ...................... 156/249; 156/246; 156/344; 350/3.61; 430/2
[58] Field of Search ............... 156/246, 249, 344; 350/3.61; 430/2

[56] References Cited

U.S. PATENT DOCUMENTS

3,674,591 7/1972 Boyd .................................. 156/272
3,944,420 3/1976 Gale et al. .
4,172,724 10/1979 Matsumoto et al. .

FOREIGN PATENT DOCUMENTS

2733703 2/1978 Fed. Rep. of Germany .
2272422 12/1975 France .

*Primary Examiner*—Robert A. Dawson
*Attorney, Agent, or Firm*—Fitzpatrick, Cella, Harper & Scinto

[57] ABSTRACT

A hologram member and a method of preparing a volume type phase hologram film includes forming a volume type phase hologram in a polymer film formed on a substrate and comprised of a vinylcarbazole polymer, separating the polymer film from the substrate and allowing the hologram to be supported on the substrate so that the surface of the hologram not having contacted the substrate, contacts the substrate.

3 Claims, No Drawings

METHOD OF PREPARING VOLUME TYPE HOLOGRAM FILM

CROSS REFERENCE TO RELATED APPLICATION

This application is a continuation-in-part of U.S. Ser. No. 195,644, filed May 18, 1988 and now U.S. Pat. No. 4,871,411.

BACKGROUND OF THE INVENTION

1. Field of the Invention

The present invention relates to a method of preparing a volume type phase hologram film, and more particularly to a method of preparing a volume type phase hologram film having sufficient flexibility and further a superiority in high diffraction efficiency, high transparency and high moisture resistance, the method being capable of being used for various purposes.

2. Related Background Art

Holography is a unique technique of forming an optical image by which an object is irradiated by an appropriately coherent wave, such as a laser beam, where the wave is modulated in amplitude and phase in accordance with the shape of the object; the modulated wave reflected upon or transmitted through the object is recorded (=hologram) and the hologram is irradiated again by the laser beam so as to reproduce an optical image of the original object.

With the recent development of holography, it has been clarified to a certain extent what material is suitable for use in holography or what characteristics, such as a hologram recording material, should have.

Thus, there have already been proposed various hologram materials such as bleached silver salt (U.S. Pat. No. 3,672,744), dichromate gelatine (U.S. Pat. No. 3,617,274), photoresists, thermoplastic resin, inorganic glass materials and ferroelectric substances. At present further studies on the properties of these materials is proceeding in the art.

The properties which a hologram recording material (or sensitive material) should have may be summarized as follows:

(1) sensitivity to a laser beam, especially to a laser beam in the visible wavelength region and high sensitivity at the same time;
(2) high resolving power;
(3) to form a hologram of high diffraction efficiency;
(4) to provide a hologram of low noise level;
(5) to yield a stable hologram; and
(6) to allow easy recording and reproducing operations.

As will be seen from the above, the requirements for a hologram recording material are very severe.

Practically, very few known hologram recording materials can satisfy the above requirements completely or at least partially to the extent that their use may be practical.

Among the above-mentioned materials, bleached silver salt and dichromate gelatine may be considered to be usable practically. However, they have particular disadvantages. The former necessitates a bleaching treatment in addition to ordinary treatment and furthermore the hologram obtained from it is poor in light fastness. The latter has a problem regarding the preservation of the hologram because the hologram obtained from this material lacks adequate stability against moisture.

To overcome such disadvantages in conventional holograms, U.S. Pat. No. 4,287,277 discloses a hologram employing polyvinyl carbazole. A hologram employing polyvinyl carbazole is suitable in use as it can satisfy the properties (1) to (6) mentioned above.

In general, volume type phase holograms are holograms in which a Bragg's grating is formed in the inside of a polymer. Diffraction light wavelength is controlled by the grating distance (or grating space), where the grating pattern comprising several thousand or more lines, is formed in a thickness of several ten $\mu$m with a grating space of 0.1 to 0.2 $\mu$m. Therefore, at the time of manufacturing a volume type phase hologram (particularly at the time of exposure to laser beam), the exposure to a laser beam must be carried out in a stationary state so that fluctuation may be suppressed within approximately 0.01 to 0.02 $\mu$m.

More specifically, at the time of the exposure to light, vibration, air-swirling caused by the passage of a laser beam, deformation of a holder of a sensitive material, thermal expansion, density gradient owing to temperature of air, etc. must be made insignificantly small. For that purpose a rigid and transparent material is used as a support for supporting the sensitive material, and, in general, glass is usually used.

However, the utility of holograms for which glass is used as the support is of very limited scope, such as displays or the like.

SUMMARY OF THE INVENTION

Accordingly, an object of the present invention is to overcome such disadvantages in the prior art to provide a technique of making a volume type phase hologram into a film, and to provide a method of preparing a volume type phase hologram film that can be applied toward various uses, such as optical coupling devices used in head-up displays and as protectors for protecting the eyes from a laser beam.

A further object of the present invention is to provide a method of preparing a volume type phase hologram film having a superiority in high diffraction efficiency, high moisture resistance and high transparency.

The above objects can be achieved by the invention described hereafter.

According to one aspect of the present invention, there is provided a method of preparing a hologram member having a surface layer on which a grating is not formed, comprising forming a volume type phase hologram in a polymer film formed on a substrate and comprised of a vinylcarbazole polymer, separating said polymer film from said substrate and then allowing said hologram to be supported on said substrate so that the surface of said hologram not having contacted said substrate, contacts said substrate.

DETAILED DESCRIPTION OF THE PREFERRED EMBODIMENTS

A typical embodiment of the present invention will be described hereafter.

First, a sensitive material layer comprised of a vinylcarbazole polymer as a principal component is formed on a light-transmissive substrate.

Utilizable as the light-transmissive substrate are substrates having sufficient rigidity such that no vibration occurs owing to the irradiation of a laser beam, and having no remarkable absorption at the visible light region.

Particularly with regard to the light transmission properties, it is preferable to use a substrate having a light transmittance of 30% or more, preferably 50% or more, at 400 nm and also a light transmittance of 40% or more, preferably 80% or more, at 450 to 800 nm when the light transmittance is measured according to the method described in ASTM D-1003.

To exemplify the light-transmissive substrates used in the present invention, there are included: glass, poly(methyl) pentene, polyvinyl chloride or the like, and, if necessary, a substrate having been made transparent by effecting drawing in the biaxial direction at the time of forming to cause orientation crystallization; and a substrate comprising an amorphous polymer such as polymethyl methacrylate, polycarbonate, polyallylate polyether ether ketone, polysulfone, a styrene/methyl methacrylate copolymer or acrylic acid polyhydric alcohol esters (CR-39).

It is also possible to use water soluble substrates in the event that the substrate is dissolved and removed in a solvent as described later.

For example, water soluble substrates are formed from water soluble alkali halides as exemplified by sodium chloride, sodium bromide, potassium chloride, potassium bromide, etc. There is no particular limitation in the shape of the substrate comprised of these alkali halides, but it may preferably be in the shape of a flat sheet of approximately from 2 mm to 10 mm in thickness. The surface of the substrate on which the sensitive material layer is formed may be smooth or of any form including curved or uneven form, where a sensitive material layer of the form corresponding to its surface is formed.

In instances in which the exposure to light at the time of forming a hologram is carried out from the substrate side, the above substrates are required to be substantially transparent, but in instances in which the exposure to light is carried out from the sensitive material layer side, they may not necessarily be required to be transparent.

The surface of the photosensitive material layer formed on the transparent substrate and comprised of a vinylcarbazole polymer, may further be subjected to surface treatment as exemplified by an electrical discharge treatment using corona, plasma or the like, a physical treatment such as a flame treatment, a chemical treatment by use of sulfuric acid, nitric acid, fluoride compounds, alkalis, silane compounds, etc. for the purpose of enhancing the affinity for the photosensitive material layer so long as the peeling step described later in detail is not hindered. It is necessary to carry out these treatments so as not to impair the required optical properties.

The photosensitive material layer formed on the transparent substrate and comprised of a vinylcarbazole polymer is used in the present invention as being superior in the overall aspects of moisture resistance, storage stability, diffraction efficiency, etc. of the resulting hologram itself.

The vinylcarbazole polymer refers to polyvinylcarbazole, an alkyl-substituted polyvinylcarbazole, a halogen-substituted polyvinylcarbazoles, and polymers comprised of these, and one or more of these can be used as desired. Specifically, there can be utilized, for example, polyvinylcarbazole, a 3-chlorovinyl carbazole polymer, a 3-bromovinyl carbazole polymer, a 3-iodovinyl carbazole polymer, a 3-methylvinyl carbazole polymer, a 3-ethylvinyl carbazole polymer, chlorinated polyvinyl carbazole, brominated polyvinylcarbazole, etc.

In particular, suited for practical use is the unsubstituted polyvinylcarbazole. It is readily available and is particularly superior in performance.

The vinylcarbazole polymer may also be optionally copolymerized with other monomers for the purpose of controlling the properties such as strength or softness, when formed into a film. Other monomers usable for such purposes include, for example, in addition to the above vinyl carbazoles, vinyl monomers copolymerizable by radical polymerization, including vinyl esters such as vinyl acetate, esters of acrylic acid and methacrylic acid, styrene and styrene derivatives, etc. Other polymers, as exemplified by polystyrene, a styrene/butadiene copolymer, a styrene/hydrogenated butadiene copolymer, can also be used by blending, so long as a hologram diffraction grating can be recorded.

These are used by selecting the appropriate proportion of addition so that the desired properties can be obtained.

In forming a hologram, the vinylcarbazole polymer is used in such a state that the polymer can be activated with radiation in the presence of an iodine compound.

Used as this iodine compound are compounds capable of coexisting in a polymer component to constitute a sensitive material layer having a sufficient sensitivity to the visible light wavelength, as exemplified by carbon tetraiodide, iodoform, ethylene tetraiodide, triiodoethane, tetraiodoethane, pentaiodoethane, hexaiodoethane, etc.

The formation of the photosensitive material layer comprised of the vinylcarbazole polymer on the transparent substrate may be carried out according to the coating method disclosed in U.S. Pat. No. 4,287,277.

Next, the photosensitive material layer is subjected to exposure to light and development processing to form the volume type phase hologram. The exposure to light may be in accordance with any of the known photosensitive methods, which may be appropriately selected depending on the type of objects, uses of holograms, etc. The exposure and development may be carried out, for example, according to the method disclosed in U.S. Pat. No. 4,287,277 etc.

More specifically, for example, an interference pattern is formed by exposure to two coherent laser beams, comprising the object beam and the reference beam, with use of an argon laser beam of (488 nm), and thereafter subjecting the photosensitive material layer to a development step comprising swelling and shrinking by using solvents.

The hologram obtained by such procedures may preferably have a thickness ranging from 4 to 20 $\mu$m. A thickness less than 4 $\mu$m may result in a lowering of the strength as a film, and a thickness more than 20 $\mu$m tends to cause cracking. The hologram may most preferably have a thickness ranging from 6 to 15 $\mu$m.

Next, the hologram as obtained above is dipped in a liquid inert to the hologram, so that a hologram layer in which the hologram diffraction grating has been recorded can be peeled from the substrate. This procedure makes it possible to obtain a hologram film without any destruction of the diffraction grating and further without causing any change in the optical properties possessed before treatment.

The liquid inert to the hologram, which is used to peel (or separate) the hologram layer from the substrate, refers to a liquid that does not dissolve the hologram layer, that penetrates into the interface between the layer and substrate without impairing at all the optical properties of the hologram to peel them from each other owing to a surface tension of the liquid, or to dissolve the substrate without exerting any action on the hologram layer.

The liquid used in such a step may be any of those that have the above properties and also should not substantially adversely affect the hologramconstituting component (especially the vinylcarbazole polymer), but, in particular, water, alcohols and saturated hydrocarbons can be particularly suitably used, which may be appropriately selected depending on the material of the substrate selected.

Preferable examples thereof are water and a mixed solvent of water with an organic low-boiling solvent. The organic low-boiling solvent may include an alkane or cycloalkanes, such as n-heptane, n-hexane, Diflon (trade name; available from Daikin Kogyo), n-pentane, n-octane, iso-octane and cyclohexane, alcohols such as methyl alcohol, ethyl alcohol, propyl alcohol, isopropyl alcohol and n-butyl alcohol, ethers such as dimethyl ether and methyl ether, etc.

Application of a physical stimulation such as a moderate heating and ultrasonic treatment to water of a low-boiling solvent generally accelerates the peeling.

The peeled hologram film floats in the medium or on the medium, and can be readily removed.

If in this peeling step it is predictable that peeling by using the solvent is difficult (for example, if the hologram film is to be thin and of low strength), it is preferably recommended that a peel layer initially is laminated on the substrate in the first step and then the photosensitive material layer is laminated thereto.

The peel layer of the present invention is used to make it easier to effect peeling of the hologram film by use of the solvent. Usable as the peel layer is for example, a layer comprised, of a polymer having a surface tension larger or smaller enough for obtaining a good peeling state than the surface tension of the hologram film (30 to 40 dyne/cm when a vinylcarbazole polymer is used), or a layer comprised of a lowmolecular weight surface improver called a silane coupling agent or titanium coupling agent.

Materials that can constitute the peel layer may specifically include, for example, polymers such as polyvinyl alcohol, polyvinyl pyrrolidone, polyethylene fluoride-propylene and polyorganosiloxane; silane coupling agents such as gamma-glycidoxypropyl trimethoxysilane and vinyl trimethoxysilane; titanium coupling agents such as isopropyltristearoyltitanate and isopropyltrioctyltitanate; etc.

The peel layer can be provided by laminating, for example, a layer comprising the above polymers on the substrate, or by treating the surface of the substrate with a solution containing the silane coupling agent or titanium coupling agent.

When peeled, the peel layer, if it is transparent, may remain on any of the substrate or the hologram film side. When the peel layer remains on the hologram film side, it may be constituted of a material that functions as a protective layer for the hologram film, or various additives capable of imparting a protective function to the peel layer may be added.

Materials for forming the peel layer and capable of functioning also as the protective layer may include, for example, polyethylene terephthalate, polyether ether ketone, polyperfluoroethylene-propylene, polyvinylidene fluoride, polyvinyl alcohol, etc.

The additives that can be added to impart the function as the protective layer may include, for example, as an ultra-violent ray absorbing agent, triazole derivatives such as 2-(hydroxyphenyl)benzotriazole, triazine derivatives such as 1,3,5-(2'-hydroxyphenyl)triazine, benzophenone derivatives such as resorcylmonobenzoate, etc.

If opaque, the peel layer may preferably be made to remain on the substrate side by suitably selecting the solvents.

In the event that the hologram itself has no supporting function, it necessary to apply a flexible support. Then the hologram film removed as above is scooped up with the flexible substrate (as exemplified by a polymer film).

The hologram comprising polyvinyl carbazole has a surface tension of 36 dyne/cm when measured according to the wetting test method described in JIS K6768. When the surface tension of the polymer film with which the hologram thrown into water and peeled and separated from the substrate is scooped up is found according to the above method, the hologram wrinkles or peels from the polymer film to curl in the case of the polymer film having the same surface tension as polyvinyl carbazole when it is scooped up and dried. On the other hand, when the polymer film having a value of 38 dyne/cm or more, more preferably 40 dyne/cm or more, is used, the adherence thereof to the hologram is so good that there is seen no wrinkle or curl of the hologram.

The polymer film may be any of films showing no swelling or dissolution in water or an organic lowboiling solvent, and the change in interfacial tension may not be required to be brought about by the change of the polymer film itself, but may be brought about by applying a physical treatment using corona, plasma, etc. or a chemical treatment using organic siloxane, epoxy, etc. to the surface of the polymer film.

There is a difference in the diffraction efficiencies measured respectively for the free surface (the surface having not come into contact with the substrate) of the hologram separated from the substrate in the liquid and from the surface having come into contact with the substrate. Accordingly, in order to obtain a hologram film having a higher diffraction efficiency, the polymer film should be supported so that it may come into contact with the free surface of the hologram.

The reason why a diffraction efficiency measured from the surface having come into contact with the substrate is higher than that from the free surface is because a grating is not formed on the surface layer, having come into contact with the substrate of the hologram film and, therefore, the presence of the surface layer results in the reduction of haze.

The thickness of the hologram film thus obtained is preferably in the range of from 10 $\mu$m to 200 $\mu$m, and more suitably in the range of from 10 $\mu$m to 100 $\mu$m.

EXAMPLES

The present invention will be specifically described below by providing Examples. The Examples are illustrative and are not intended to limit the invention.

EXAMPLE 1

On a washed glass substrate, a solution obtained by dissolving 2.5 g of N-polyvinyl carbazole and 0.2 g of carbon tetrachloride in 30 g of monochlorobenzene was applied in a dark place by means of a spinner (Mikasa Spinner, 1H-2), followed by drying to obtain a hologram-forming sensitive material layer of 8.9 μm in layer thickness.

Using an argon laser (488.0 nm), this sensitive material layer was irradiated with parallel beams from two opposite opposite directions of the sensitive material layer to effect exposure to light.

Thereafter, the sensitive material layer was successively subjected to development processing according to the following steps (1) to (3), followed by drying to obtain a volume type phase hologram.

(1) Dipped in toluene for 2 minutes, 25° C.
(2) Dipped in xylene for 3 minutes, 25° C.
(3) Dipped in heptane for 3 minutes, 25° C.

The resulting hologram was left in water for 30 minutes to permit the hologram to peel from the glass substrate.

Subsequently, a polyester film (thickness: 50 μm) having a surface tension of 40 dyne/cm according to JIS K6768 was dipped in water to scoop up the hologram in such a manner that the hologram surface which had come into contact with the glass substrate faced the polyester film, followed by drying.

The volume phase hologram film thus obtained had a diffraction peak at 520 nm, a diffraction light half width of 18 nm, and a maximum diffraction efficiency of 95%. Also the transmittance at 600 nm showed 85%.

On the other hand, a hologram scooped up such that the hologram surface which had not faced the glass substrate, now faced the polyester film, followed by drying was prepared.

The diffraction efficiency of the hologram film thus obtained reached 97% at its maximum, and thus the diffraction efficiency was higher than that of the hologram film previously obtained. There was seen no change in the other properties of the hologram.

The section of the hologram film was observed by means of a TEM. It was seen that a grating was not formed in a layer very close to the surface.

The resulting films showed sufficient flexibility, had superior adherence between the hologram and the polyester film, and had superior film properties without causing the hologram to naturally peel from the polyester films or wrinkle.

EXAMPLE 2

Example 1 was repeated to prepare a hologram film, except that a biaxially oriented polypropylene film (thickness: 45 μm) having a surface tension of 42 dyne/cm was used in place of the polyester film. As a result, there were obtained the same results as in Example 1.

EXAMPLE 3

On a washed glass substrate, an N-polyvinyl carbazole sensitive material layer was formed in the same manner as in Example 1 except that the peel layer was provided by coating with an aqueous 7% solution of polyvinyl alcohol to a thickness of 2 μm by means of a spinner, followed by exposure to light and development processing.

The resulting laminated body was left in water for 10 minutes to permit the hologram to peel from the glass plate.

The two resulting holograms thus obtained were placed on the same polyester films as used in Example 1 to obtain two volume type phase hologram films. In one volume type phase hologram film, its hologram surface which had faced the glass substrate faced the surfaces of the polyester film, and in the other, the hologram surface which had not faced the glass surface faced the surface of the polyester film.

The holograms thus obtained had a diffraction peak half width of 18 nm and a transmittance of 81%. The diffraction efficiency was 82% for the film on which the hologram was placed in such a manner that hologram surface which had faced the glass substrate now faced the polyester film, and 89% for the other film.

The section of the hologram with a diffraction efficiency of 98% was observed by means of a TEM. As a result, a grating was not observed to be formed in a layer very close to the surface.

There were also exhibited superior film properties similar to those in Example 1.

EXAMPLE 4

Trimethoxyvinylsilane (available from Shin-Etsu Chemical Co., Ltd.) was dissolved in ethyl alcohol to give a concentration of 5%, and a glass plate was dipped in the resulting solution for 1 hour, and thereafter allowed to stand in an oven at 80° C. for 4 hours.

On this glass substrate, the photosensitive material used in Example 1 was applied by means of a spinner to form a sensitive material layer 20 μm thick.

Subsequently, using an argon laser (488 nm), irradiation of convergent light was carried out from one side of the sensitive material layer, and irradiation of parallel light was made from the other side opposite thereto to record a diffraction grating having a function of a convex lens.

Thereafter, this sensitive material layer was subjected to the development processing in the same manner as in Example 1 to obtain a volume type phase hologram.

The hologram obtained was left in methanol for 30 minutes to peel the hologram from the glass plate, thus obtaining a volume type phase hologram film.

The resulting hologram film had a diffraction peak at 515 nm, and showed a maximum diffraction efficiency of 78%, a diffraction peak half width of 6 nm and a transmittance of 72%

EXAMPLE 5

Example 4 was repeated to prepare a volume type phase hologram film, except that irradiation of argon laser beams (488 nm) were effected as parallel beams from the opposite two directions of the sensitive material layer to conduct exposure to light.

The hologram free surface and the hologram surface which had faced the glass substrate had diffraction efficiencies of 76% and 80%, respectively, and the hologram surface which had faced the glass substrate showed high diffraction efficiency at any of plural measurement points.

The width of the diffraction efficiency was found to be 5.9 nm, and the transmittance, 72%, being the same in each hologram surface.

EXAMPLE 6

Bisphenol allylate resin substrate (TS-26, available from Tokuyama Soda Co., Ltd.) of 2 mm thick was washed with methanol, and the photosensitive material used in Example 1 was applied by means of a spinner to form a sensitive material layer 7.6 μm thick.

Using an argon laser (488 nm), irradiation of convergent light was effected from one side of the sensitive material layer, and irradiation of parallel light was effected from the other side opposite thereto to record a diffraction grating having a function of a concave lens. This was subjected to the development and the substrate-peeling treatment in the same manner as in Example 1.

Thereafter, the polyester film as in Example 1 was dipped in water, and the hologram was scooped up such that the surface which had come into contact with the substrate now came into contact with the polyester film, followed by drying.

The volume type phase hologram film thus obtained had a diffraction peak at 520 nm and showed a half width of 19 nm, a diffraction efficiency of 96% and a transmittance of 86% at 600 nm, having the function of a concave lens.

EXAMPLE 7

Diethylene glycol bisacrylate resin substrate (TS-16, available from Tokuyama Soda Co., Ltd.) 2 mm thick was washed with ethanol, and the solution of polyvinylcarbazole photosensitive material used in Example 1 was applied to the substrate by means of a spinner to form a sensitive material layer of 8.1 μm thick.

Irradiation of parallel beams from an argon laser (488nm) were effected on the opposite two directions of this sensitive material layer to conduct exposure to light.

Subsequently, the resulting sensitive material layer was developed in the same manner as in Example 5, and thereafter dipped in a mixed solvent of water/methanol =7/3 to peel the hologram from the resin substrate, and the hologram was scooped up with a polyester film having a surface tension of 45 dyne/cm, followed by drying.

Reflective diffraction efficiencies were measured, when light was made incident from the respective surfaces of the hologram free surface at the time of exposure to light and the surface having come into contact with the resin substrate at the time of the exposure to light, were found to be 92% for the free surface and 97% for the surface having come into contact with the resin substrate.

As other properties of the hologram, the half width was found to be 19 nm, and the transmittance at 600 nm, 86%, being the same in both the above surfaces.

EXAMPLE 8

On a sodium chloride crystal substrate (available from Nippon Bunko K.K.) 5 mm thick, 30 mm diameter smooth on its surface, a solution obtained by dissolving 2.5 g of poly(N-vinylcarbazole) and 0.2 g of carbon tetrachloride in 30 g of monochlorobenzene was applied in a dark place by means of a spinner (Mikasa Spinner, 1H-2), followed by drying to obtain a hologram-forming sensitive material layer of 5.0 μm in layer thickness.

On this sensitive material layer, an image corresponding to a desired object was recorded according to the Denisyuk's method using an argon laser (488 nm) and under the condition of the offset angle of 70° and the light intensity ratio of 1:1 (the sum of light intensities of the both beams was 3 mW/cm² right before incidence of light).

After exposure to light, the sensitive material layer was successively processed according to the following steps (1) to (3) to obtain a hologram.

(1) Dipped in toluene at 20° C. for 2 minutes.
(2) Dipped in xylene at 30° C. for 3 minutes.
(3) Dipped in n-heptane at 25° C. for 3 minutes, followed by drying.

After development, the hologram plate was dipped in hot the water of 80° C. for 60 minutes to dissolve the sodium chloride substrate in part, a hologram film was floated on the water surface, and this was scooped up on a polyethylene terephthalate film having a surface tension of 40 dyne/cm, followed by washing with water and drying to obtain a volume type phase hologram film of the present invention.

EXAMPLE 9

On the substrate used in Example 8, the photosensitive material solution of Example 1 was applied to form a sensitive material layer of 8.0 μm thick, and irradiation of parallel beams from an argon laser (488 nm) was effected from the opposite two directions of the sensitive material layer to conduct exposure to light.

Development was carried out in the same manner as in Example 1, and the hologram was peeled from the substrate in the same manner as in Example 6.

Subsequently, on the polypropylene film (substrate) used in Example 2, the two holograms as obtained above were scooped up in such a manner that (1) in one hologram its hologram free surface at the time of exposure to light and (2) in the other hologram its surface having come into contact with the substrate; each faced the substrate surface respectively, followed by drying.

Light was made incident on each of the hologram free surfaces and the surface having come into contact with the sodium chloride substrate to measure the reflective diffraction efficiency revealed that the reflective diffraction efficiency was 90% for the free surface and 92% for the sodium chloride substrate. The transmittance (600 nm) was found to be 83%.

The invention is not to be limited except as set forth in the claims which follow.

We claim:

1. A method of preparing a hologram member having a surface layer on which a grating is not formed, comprising forming a volume type phase hologram in a polymer film formed on a polymer film substrate and comprised of a vinylcarbazole polymer, separating said polymer film from said polymer film substrate, and then allowing said hologram to be supported on said polymer film substrate so that the surface of said hologram not having contacted said polymer film substrate, contacts said polymer film substrate.

2. A method of preparing a hologram member having a surface layer on which a grating is not formed, comprising forming a volume type phase hologram in a polymer film formed on a flexible substrate and comprised of a vinylcarbazole polymer, separating said polymer film from said flexible substrate, and then allowing said hologram to be supported on said flexible substrate so that the surface of said hologram not having contacted said flexible substrate, contacts said flexible substrate.

3. A method of preparing a hologram member having a surface layer on which a grating is not formed, comprising forming a volume type phase hologram in a polymer film formed on a substrate and comprised of a vinylcarbazole polymer, separating said polymer film from said substrate, and then allowing said hologram to be supported on said substrate so that the surface of said hologram not having contacted said substrate, contacts said substrate, wherein said hologram has a film thickness of 4 to 20 μm.

* * * * *